(12) United States Patent
Snyder

(10) Patent No.: US 9,418,795 B2
(45) Date of Patent: *Aug. 16, 2016

(54) METHOD AND APPARATUS FOR CAPACITORS HAVING ENGINEERED ELECTRODES WITH VERY HIGH ENERGY DENSITY

(71) Applicant: GranBlueTech, L.L.C., Burnsville, MN (US)

(72) Inventor: John P. Snyder, Edina, MN (US)

(73) Assignee: GranBlueTech, L.L.C., Burnsville, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/312,664

(22) Filed: Jun. 23, 2014

(65) Prior Publication Data

US 2014/0301021 A1    Oct. 9, 2014

Related U.S. Application Data

(62) Division of application No. 13/089,305, filed on Apr. 18, 2011, now Pat. No. 8,760,846.

(60) Provisional application No. 61/325,173, filed on Apr. 16, 2010.

(51) Int. Cl.
| | |
|---|---|
| *H01G 4/02* | (2006.01) |
| *H01G 9/00* | (2006.01) |
| *H01G 11/26* | (2013.01) |
| *H01G 11/86* | (2013.01) |
| *H01L 49/02* | (2006.01) |
| *H01G 4/005* | (2006.01) |

(52) U.S. Cl.
CPC .............. *H01G 11/26* (2013.01); *H01G 4/005* (2013.01); *H01G 4/02* (2013.01); *H01G 11/86* (2013.01); *H01L 28/40* (2013.01); *Y02E 60/13* (2013.01); *Y02T 10/7022* (2013.01); *Y10T 29/417* (2015.01)

(58) Field of Classification Search
None
See application file for complete search history.

(56) References Cited

U.S. PATENT DOCUMENTS

| | | | | |
|---|---|---|---|---|
| 5,606,486 | A * | 2/1997 | Moncrieff | H01G 4/20 29/25.42 |
| 7,382,603 | B2 * | 6/2008 | Timonov | H01M 4/137 361/502 |
| 7,842,196 | B2 * | 11/2010 | Yoshida | C08L 65/00 252/500 |
| 8,462,482 | B2 * | 6/2013 | Sasaki | H01G 4/008 361/301.1 |
| 8,760,846 | B1 * | 6/2014 | Snyder | H01G 4/02 361/312 |
| 2009/0002922 | A1 * | 1/2009 | Doffing | H01G 9/012 361/517 |

* cited by examiner

*Primary Examiner* — Dion R Ferguson
(74) *Attorney, Agent, or Firm* — Charles A. Lemaire; Jonathan M. Rixen; Lemaire Patent Law Firm, P.L.L.C.

(57) ABSTRACT

An apparatus and associated method for an energy-storage device (e.g., a capacitor) having a plurality of electrically conducting electrodes including a first electrode and a second electrode separated by a non-electrically conducting region, and wherein the non-electrically conducting region further includes a non-uniform permittivity (K) value. In some embodiments, the method includes providing a substrate; fabricating a first electrode on the substrate; and fabricating a second electrode such that the second electrode is separated from the first electrode by a non-electrically conducting region, wherein the non-electrically conducting region has a non-uniform permittivity (K) value. The capacitor devices will find benefit for use in electric vehicles, of all kinds, uninterruptible power supplies, wind turbines, mobile phones, and the like requiring wide temperature ranges from several hundreds of degrees C. down to absolute zero, consumer electronics operating in a temperature range of −55 degrees C. to 125 degrees C.

20 Claims, 17 Drawing Sheets

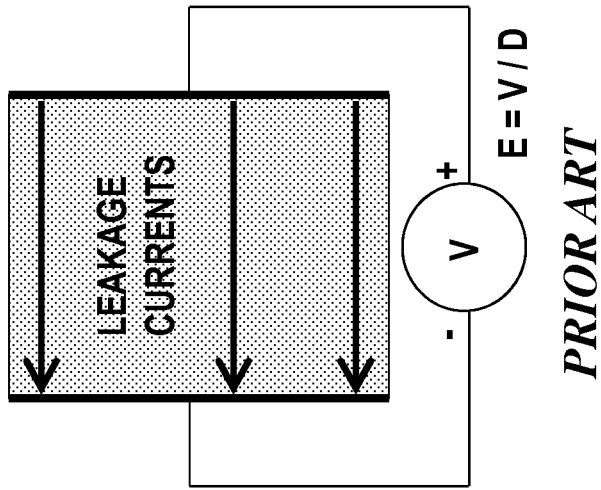
FIG. 1B
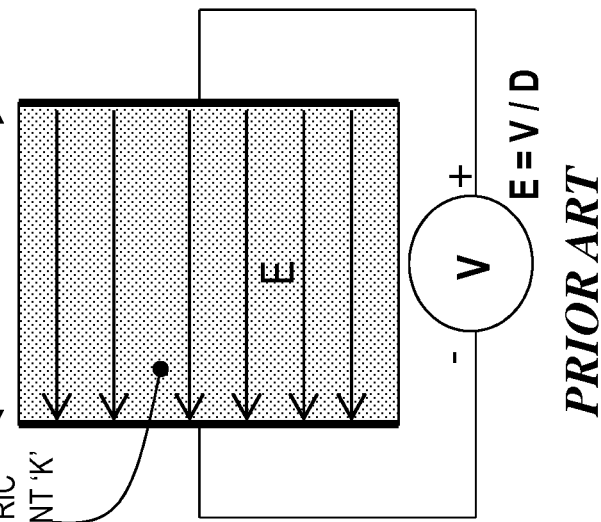
FIG. 1A *PRIOR ART*

FIG. 9

| | ENERGY DENSITY (WATT HOURS / LITRE) |
|---|---|
| EDLC PRIOR ART "ULTRACAP" | 10 |
| LI-ION BATTERY PRIOR ART | 400 |
| GASOLINE PRIOR ART | 1850 (ASSUMES 20% ICE EFFICIENCY) |
| THE PRESENT INVENTION | ~10 @ 4.0E9 V/M<br>~400 @ 2.5E10 V/M<br>~1850 @ 5.5E10 V/M<br>(ASSUMES 50% FILL FACTOR) |

1001

1101

1202

FIRST PATTERNING AND ETCH

1201

'RELEASE' PATTERNING AND ETCH

US 9,418,795 B2

METHOD AND APPARATUS FOR CAPACITORS HAVING ENGINEERED ELECTRODES WITH VERY HIGH ENERGY DENSITY

CROSS-REFERENCE TO RELATED APPLICATIONS

This application is a divisional of, and claims priority to, U.S. patent application Ser. No. 13/089,305 filed Apr. 18, 2011, by John P. Snyder, titled "Apparatus and method for a capacitor with engineered electrodes and position dependent permittivity for very high energy density" (which issued as U.S. Pat. No. 8,760,846 on Jun. 24, 2014), which claims priority benefit under 35 U.S.C. §119(e) to U.S. Provisional Patent Application No. 61/325,173 filed Apr. 16, 2010, by John P. Snyder, titled "Apparatus and method for a capacitor with engineered electrodes and position dependent permittivity for very high energy density," both of which are incorporated herein by reference in their entirety.

FIELD OF THE INVENTION

The present invention relates to electrical-charge-storage devices and methods, and more particularly to apparatus and methods for capacitor devices having engineered electrodes and position dependent permittivity for providing very high energy densities.

BACKGROUND OF THE INVENTION

At the present time there is no known good solution to the general problem of energy storage. A good solution is one that needs to have as many of the following characteristics as possible:
1) High energy density per volume and per mass
2) Low cost of manufacture
3) Unlimited number of charge/discharge cycles
4) Capable of fast charge/discharge
5) Insensitivity to temperature
6) Manufactured from non-toxic, readily available materials Li-ion batteries, and most chemical batteries, meet criteria 1) and 2) but fall short on all the others. State-of-the-art Electrochemical Double Layer Capacitors (EDLCs) fall short on 1) and 2) but satisfy the remaining criteria adequately.

Li-Ion batteries have an energy density of around 400 Watt-hours/litre (W-Hr/l) while EDLCs typically have an energy density of around 10 W-Hr/l. However, UltraCaps can be cycled millions if not tens of millions of times, whereas Li-Ion batteries can be cycled, generally, at most 1000 times before wearing out. Further, Li-Ion batteries are low cost as well, usually around $1 per W-Hr, whereas EDLCs currently cost about $13 per W-Hr.

FIG. 1A shows the relationship between energy density, dielectric constant K and electric field strength E for a given capacitor. Note that while the energy density is linear in K it goes as the square of E. To maximize energy density it is necessary to optimize the KE2 product. Energy density (energy per volume) in a conventional parallel plate capacitor is given by:

$$\frac{1}{2} K \varepsilon_0 E^2,$$

with units of Joule/m³, and where E (V/m) is the electric field, K is the dielectric constant (K=1 for vacuum, K=3.9 for pure $SiO_2$), and $\varepsilon_0$ (Farad/m) is the permittivity of free space. Note that the energy density goes as the square of e and is only linear in K.

FIG. 1B shows that as the voltage across the plates of the capacitor is increased electric field strength E and energy density monotonically rise—along with leakage currents between the plates. Leakage currents allow the capacitor to discharge itself, leading to a reduction in 'retention time', that is, the amount of time it takes for a capacitor to lose a certain fraction of its initial charge. As a practical matter leakage currents place an upper limit on the KE2 product. For a given capacitor, the maximum applied voltage (and therefore the E-field and the energy density) is limited by leakage currents between the plates. Increased leakage currents lead to reduced retention time (e.g., time to lose 10% of stored energy). Thus there is a tradeoff between energy density and retention time. The higher the former (i.e., the energy density) the lower the latter (i.e., retention time). The magnitude of leakage will be dependent on the choice of materials used to construct the capacitor (including the electrodes and the dielectric fill), as well as its structural architecture.

As the importance of and demand for energy storage continues to increase, there is a need for an energy storage technology that has the characteristics described above.

BRIEF SUMMARY OF THE INVENTION

An apparatus and associated method for an energy-storage device (e.g., a capacitor) having a plurality of electrically conducting electrodes including a first electrode and a second electrode separated by a non-electrically conducting region, and wherein the non-electrically conducting region further includes a non-uniform permittivity (K) value. In some embodiments, the method includes providing a substrate; fabricating a first electrode on the substrate; and fabricating a second electrode such that the second electrode is separated from the first electrode by a non-electrically conducting region, wherein the non-electrically conducting region has a non-uniform permittivity (K) value. The capacitor devices will find benefit for use in electric vehicles, of all kinds, uninterruptible power supplies, wind turbines, mobile phones, and the like requiring wide temperature ranges from several hundreds of degrees C. down to absolute zero, consumer electronics operating in a temperature range of −55 degrees C. to 125 degrees C.

BRIEF DESCRIPTION OF THE DRAWINGS

FIG. 1A is a schematic diagram of a prior art capacitor 101.
FIG. 1B is a schematic diagram of a prior art capacitor 102.

FIG. 9 is a table 901 comparing the energy density in Watt-Hours per Liter for various energy storage technologies, according to some embodiments of the present invention.

DETAILED DESCRIPTION OF THE INVENTION

Figure 2:
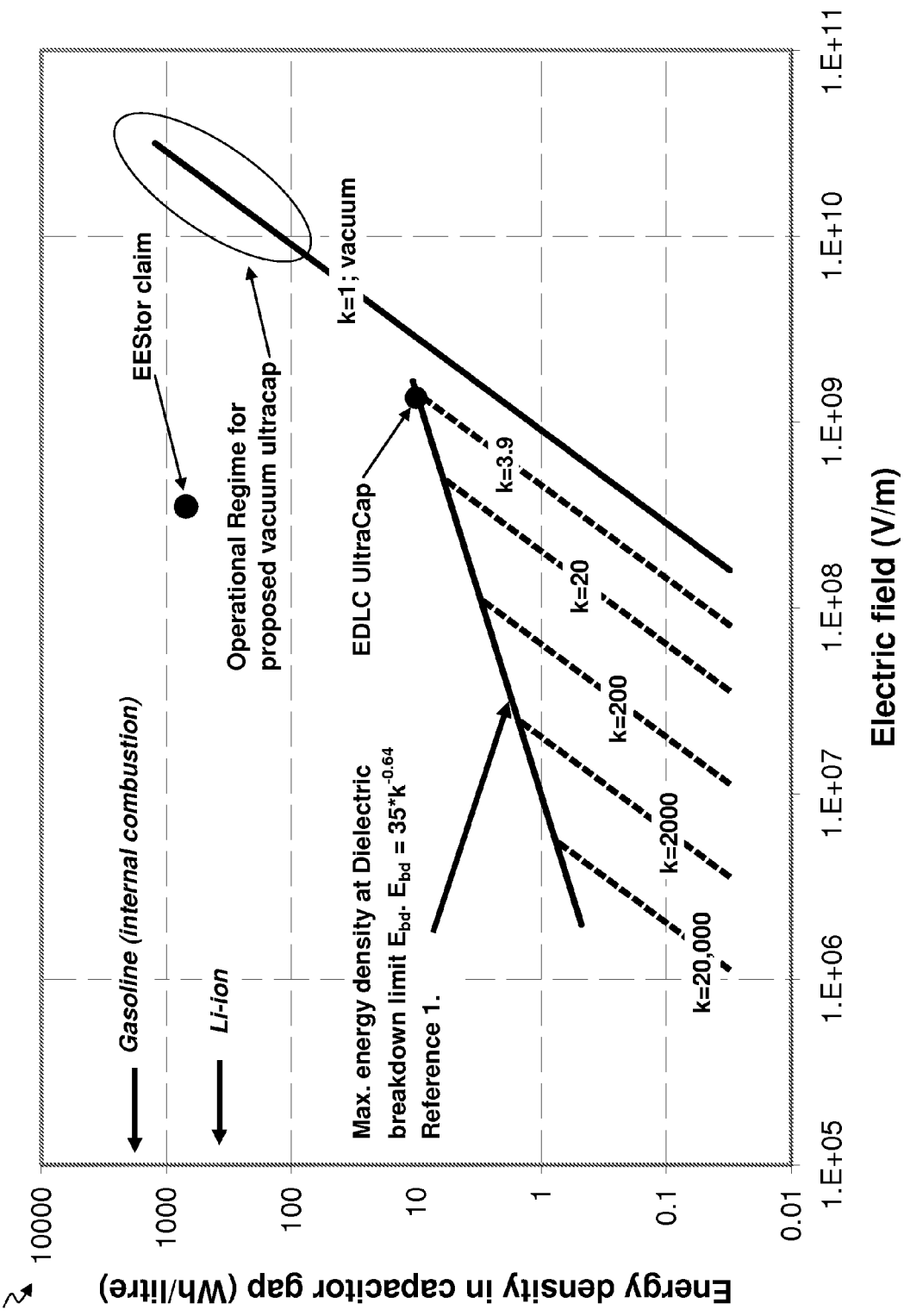
FIG. 2 is a graph 201 of the energy density in a capacitor gap (W-Hr/liter) as a function of the electric field in the capacitor gap for gap materials with a variety of dielectric constants (i.e., K).

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component that appears in multiple figures. Signals and connections may be referred to by the same reference number or label, and the actual meaning will be clear from its use in the context of the description.

The maximum energy density for a conventional capacitor using a dielectric fill between the capacitor plates is provided by a fundamental relationship that exists between a material's dielectric constant and the maximum electric field that a material can withstand before it begins to experience severe leakage, or even breakdown. McPherson and colleagues at Texas Instruments studied the correlation between breakdown voltage and dielectric constant as was discussed in their paper, ("Trends in the Ultimate Breakdown Strength of High Dielectric-Constant Materials," Joe W. McPherson, Jinyoung Kim, Ajit Shanware, Homi Mogul, and John Rodriguez, IEEE Trans Electron Devices, 50, 1771 (2003). These authors developed a thermo-chemical model for dielectric breakdown based on the enthalpy of activation needed to rupture, or permanently distort the polar bond in a dielectric material. The thermo-chemical model allows the breakdown voltage for any metal-oxide dielectric to be scaled against the known $E_{bd}$ of another oxide. $SiO_2$ was chosen as the reference material because of the large body of literature related to this dielectric. Their model is deterministic in the sense that all parameters other than $E_{bd}$ of $SiO_2$ are physical parameters, i.e. local coordination number, melting point, and dielectric constant. The model predicts that the breakdown field will have an inverse relationship to the dielectric constant K with the best fit to a range of dielectric oxides given by $E_{bd}=35 K^{-0.64}$.

McPherson and colleagues also studied dielectric breakdown for four dielectrics ($SiO_2$, HfSiON, $Ta_2O_3$, and PZT) under identical test conditions using time-dependent dielectric breakdown methods. This set of dielectrics ranges in K from 3.9 to 250. The empirical relationship between $E_{bd}$ and K for these four materials is given by $E_{bd}=29.9 K^{-0.65}$.

This result is in good agreement with the thermo-chemical model and provides confidence that the general relationship between breakdown field and dielectric constant can be used to evaluate the high-energy density limit of various dielectrics in a parallel-plate capacitor structure.

FIG. 2 is a graph 201 of the energy density in a capacitor gap (W-Hr/liter) as a function of the electric field in the capacitor gap for gap materials with a variety of dielectric constants (i.e., K). FIG. 2 shows the relationship between the applied electric field and the energy density (energy/volume) stored in the capacitor gap ($1/2$ K $\epsilon_0$ $E^2$). Higher K value dielectrics allow greater energy density to be achieved at low fields, but the ultimate limit of high energy density increases with decreasing K due to the inverse relationship between $E_{bd}$ and K as described above. The ultimate energy density limit for conventional, dielectric filled capacitors having dielectrics with dielectric constants (i.e., K's) ranging from 20,000 (e.g., doped barium titanate) down to 3.9 (e.g., $SiO_2$) is indicated by the solid line 209 in FIG. 2.

In FIG. 2, the energy density (J/m$^3$) for a parallel-plate capacitor as a function of electric field E(V/m) is energy-density=$\epsilon_0 K E^2/2$. The equation for the dielectric breakdown limit (i.e., the solid line 209), $E_{bd}$=35K$^{-0.64}$ is the thermochemical fit given by McPherson, et al., described above. The point for EEStor's energy density is derived from information given on the company's website and the value is ~1000× higher than the expected fundamental material limit.

In some embodiments, the present invention provides electric fields in the capacitor gap, and therefore energy densities, comparable with and even superior to those of lithium-ion battery technology and hydrocarbon energy storage.

As shown in FIG. 2, the highest energy density for a parallel plate capacitor with a dielectric medium is for a high-quality, low-k dielectric, like SiO$_2$, operating at the highest possible electric field that is below the dielectric breakdown field. At the breakdown field limit for SiO$_2$, ~1.5×10$^9$ V/m, the maximum energy density in the capacitor gap is ~4×10$^7$ J/m$^3$, or units comparable to battery specifications, (i.e., ~10 W-Hr/liter). This is comparable to existing Electrochemical Double-Layer Capacitors (EDLC) Ultracaps and a factor of 40-45× less than the capability of current lithium-ion battery technology.

Because the ultimate limit to energy density in a parallel plate capacitor is determined by the breakdown of the dielectric medium at very high electric fields, in some embodiments, the present invention uses a capacitor structure that has no dielectric medium to breakdown, that is, a vacuum gap capacitor, to circumvent the dielectric breakdown limitation. In some embodiments, the capacitor structure having no dielectric medium in the capacitor gap of the present invention is referred to as a "high-K thin-film ultra-capacitor" (HKTF UltraCap). In FIG. 2 the energy density vs. electric field for a vacuum gap capacitor (K=1) is shown by the solid line 210. In some embodiments, without the limitations of dielectric breakdown, it is possible to achieve electric fields in the capacitor gap, and therefore energy densities, comparable with and even superior to those of lithium-ion battery technology and hydrocarbon energy storage.

Figure 3:
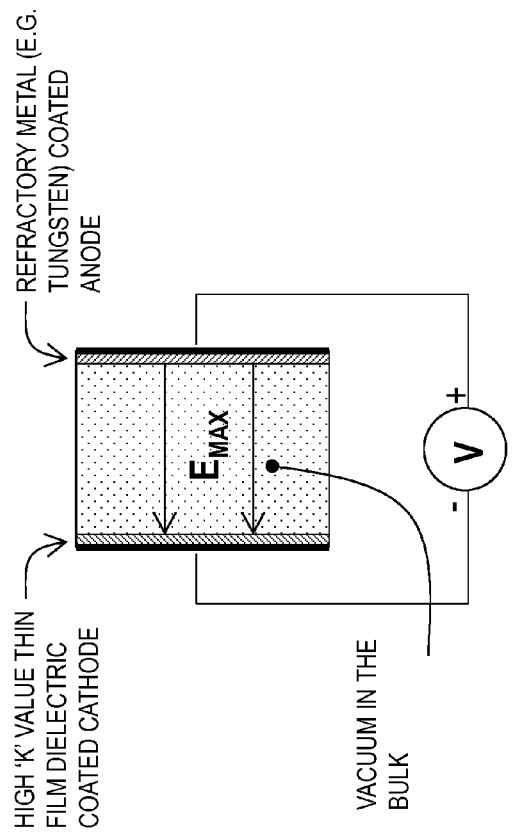
FIG. 3 is a schematic diagram of an ultra-high energy density capacitor 301, according to some embodiments of the present invention.

FIG. 3 is a schematic diagram of an ultra-high energy density capacitor 301 (i.e., HKTF UltraCap), according to some embodiments of the present invention. In some embodiments, the HKTF UltraCaps allows for maximum energy storage in a capacitor (e.g., parallel-plate capacitors). Instead of maximizing the dielectric constant and accepting the lower limitations on electric field and energy density the high-K medium imposes, the present invention provides apparatus and methods in which capacitor structures are designed and materials are chosen to maximize electric field in the capacitor gap region. In some embodiments, vacuum as the dielectric, with a K value of 1.0, affords the possibility of larger breakdown fields than can be obtained with any physical material. Because vacuum represents the absence of material, the physics of current leakage and breakdown are fundamentally different than those considered by McPherson et al., above. By understanding the leakage and breakdown mechanisms unique to vacuum capacitors, energy densities much greater than predicted by the dielectric breakdown model of FIG. 2 can be obtained.

At 1.5 e9 J/m$^3$ (i.e., 1.5 times 10$^9$ joules per cubic meter) (~1.8 e10 V/m E-field (i.e., ~1.8 times 10$^{10}$ volts per meter)), the vacuum capacitor of the present invention will have an energy density equivalent to or greater than a Li-Ion battery. At 7 e9 J/m$^3$ (i.e., 7 times 10$^9$ joules per cubic meter) (~4 e10 V/m E-field (i.e., ~4 times 10$^{10}$ volts per meter electric field)), the energy density of the present invention will surpass the effective energy density of gasoline.

In some embodiments, the present invention provides energy densities and specific energies comparable with and even superior to Li-ion batteries at a competitive cost and retains all the compelling attributes of standard capacitors. In some embodiments, the present invention minimizes leakage current, and therefore maximizes energy density, by using vacuum between the capacitor plates instead of the conventional dielectric fill material, and by using electrodes engineered with thin insulating films to significantly reduce leakage due to electron field emission.

A specific example of the vacuum capacitor of the present invention is illustrated in FIG. 3. In some embodiments, the metallic plates (312 and 313) are separated by a vacuum 311 with residual gas pressure low enough to ensure that leakage currents due to gas ionization are negligible. In some embodiments, the anode 312 is coated with a thin film of Tungsten 315 to mitigate field evaporation of anode material, while the cathode 313 is coated with a very thin film 314 (~3 nm) of a high-K dielectric (e.g., TiO$_2$ K=~50) to suppress electron field emission from the conduction band of the metal cathode 313. Voltage source 99 is used to charge capacitor 301.

In some embodiments, such as shown in FIG. 3, the structure of the capacitor of the present invention is engineered so as to mitigate the four major sources of leakage current between the plates: ionization of residual gas, field evaporation of material from the anode, field emission of electrons from the conduction band of the metallic cathode, and field emission of electrons from the valence band of the cathode dielectric.

Figure 17:
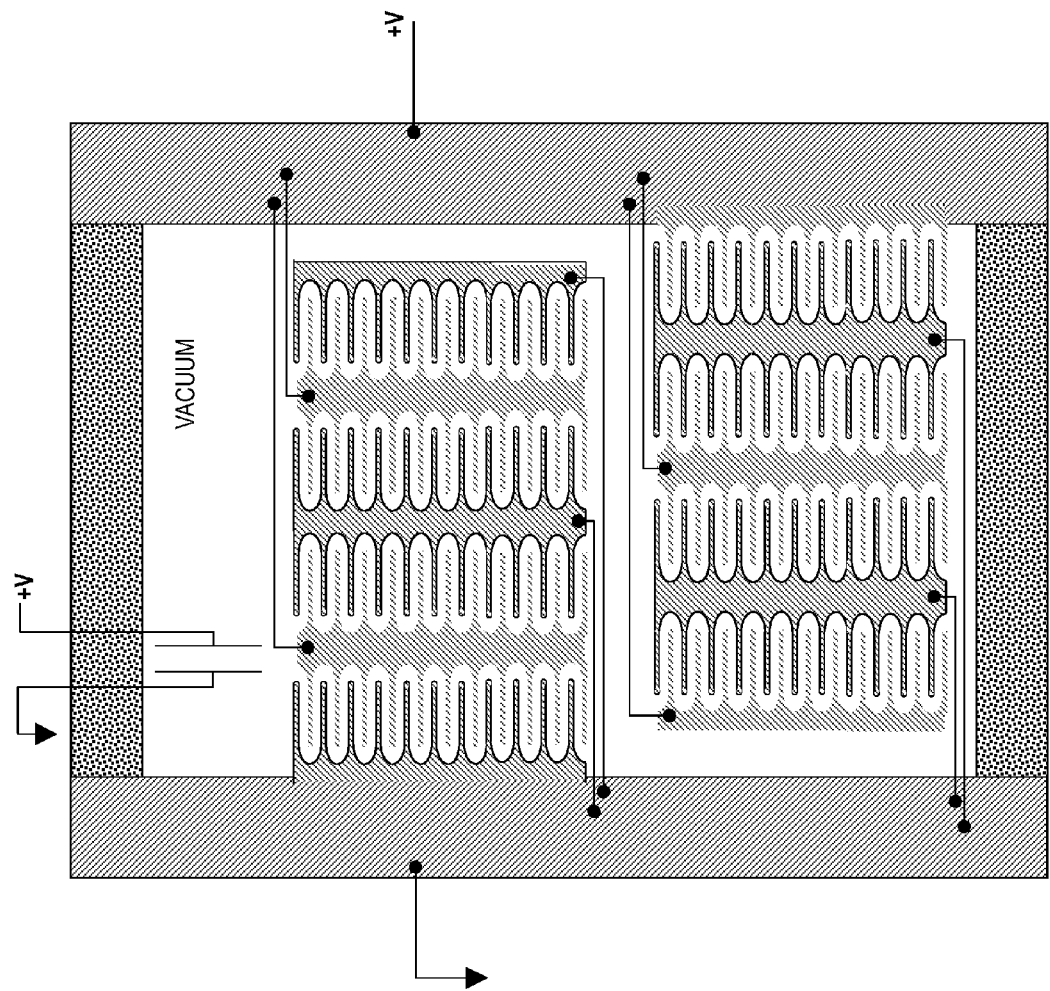
FIG. 17 is a plan-view cross-section of an ultra-high energy density capacitor assembly 1701, according to some embodiments of the present invention.
Figure 18:
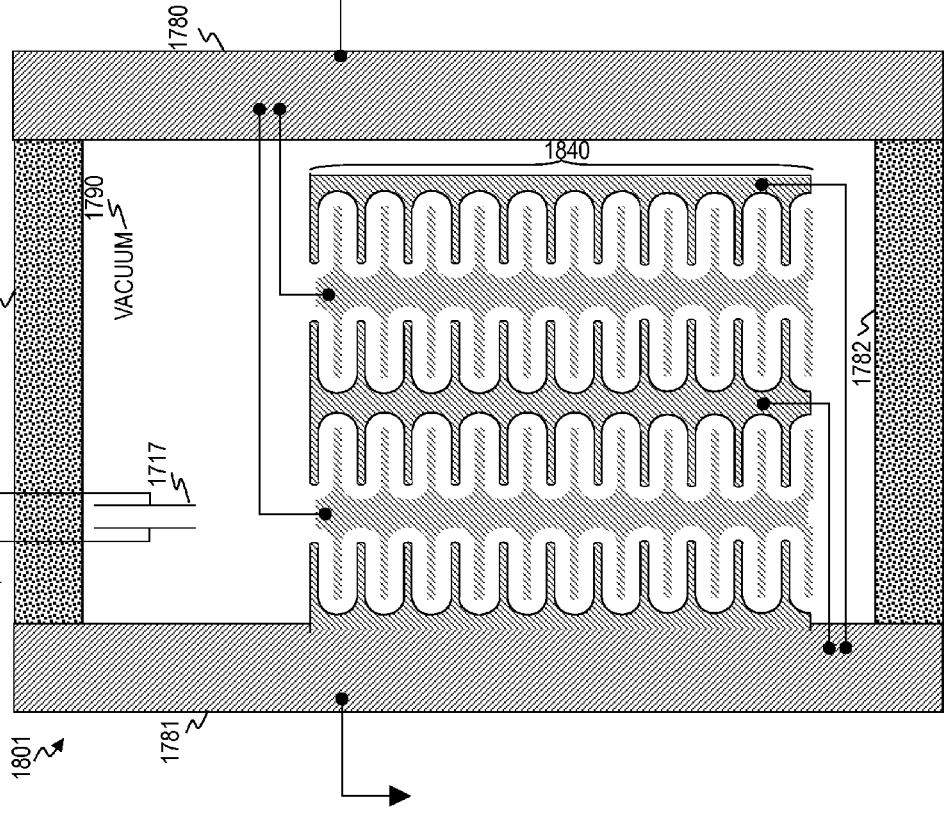
FIG. 18 is a plan-view cross-section of an ultra-high energy density capacitor assembly 1801, according to some embodiments of the present invention.

In some embodiments, gas ionization currents are minimized by vacuum bonding the anode 312 and cathode 313 structures together so as to form a cavity. In some other embodiments, dedicated micro-Titanium sublimation pumps and high-electric-field micro-ion pumps are integrated with the main capacitor cavity and used to getter residual gas molecules prior to actual use of the capacitors of interest. This technique is shown in FIG. 17 and FIG. 18 and described in more detail below.

Figure 4:
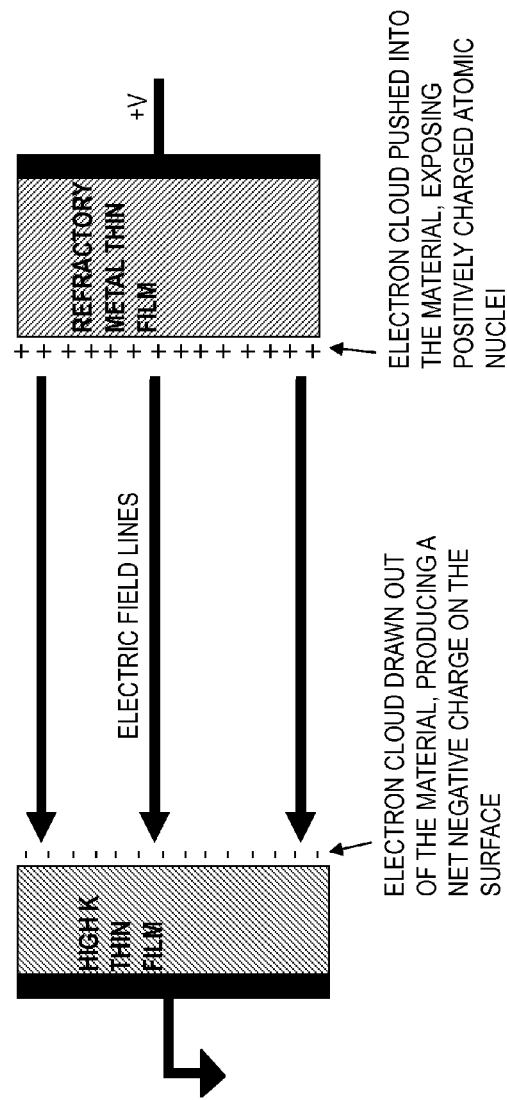
FIG. 4 is a schematic diagram of an ultra-high energy density capacitor 401, according to some embodiments of the present invention.

FIG. 4 is a schematic diagram of an ultra-high energy density capacitor 401, according to some embodiments of the present invention. A description at the atomic level of the positive and negative charge on the anode 412 and cathode 413 respectively is given in FIG. 4. First principles calculations as well as experimental results have shown that field evaporation thresholds as high as 6 e10 V/m (i.e., 6 times 10$^{10}$ volts per meter), can be obtained for high-melting-point refractory metals such as Tungsten and Molybdenum as described in the paper "First-Principles Study on Field Evaporation of Surface Atoms from W(011) and Mo(011) Surfaces," by Tomoya Ono, Surface Science, Vol. 557, Issue 1, 20 February 2005, Pages 42-46. In some embodiments, the anode 412 is coated with a thin film of tungsten 315 and is capable of withstanding an electric-field strength of ~1.8 e10 V/m (i.e., 1.8 times 10$^{10}$ volts per meter) without experiencing field evaporation of tungsten 415 from the anode 412.

FIG. 4 shows an atomic view of charge on the anode 412 and the cathode 413 for the capacitor of the present invention. On the anode 412, positively charged metal ion cores 98 are exposed due to the electron cloud being forced into the bulk of the metal thin-film material 415. On the cathode 413, the electron cloud 97 is drawn out of the high-K thin film 414. If the electric field strength is substantially increased (e.g., greater than ~1.0 e11 V/m (i.e., ~1.0 times 10$^{11}$ volts per meter)), significant numbers of electrons from the cathode 413 and/or metal ions from the anode 412 will flow between the plates of the capacitor.

Figure 5:
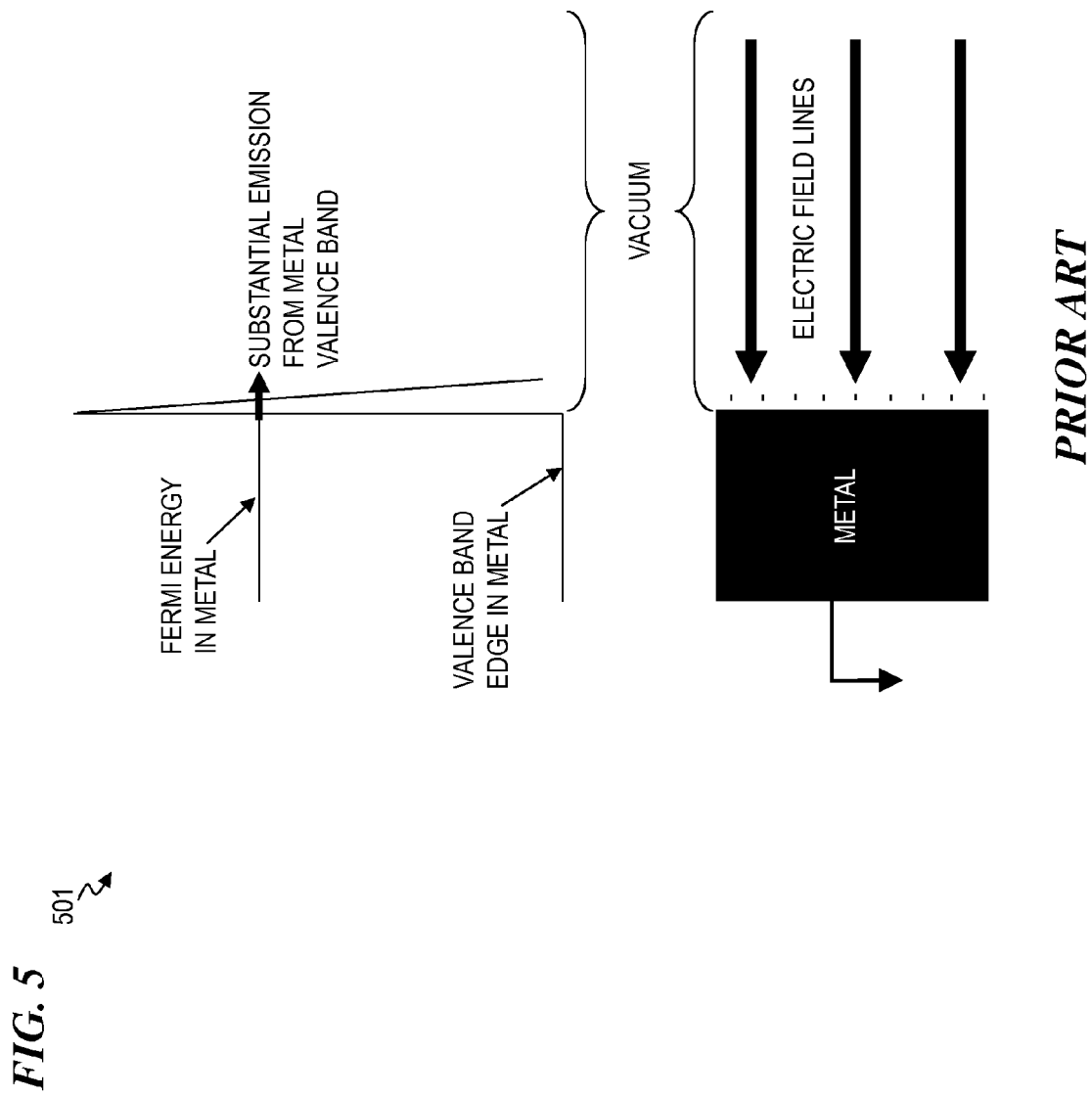
FIG. 5 is a schematic diagram of a cathode of a conventional capacitor 501 and the corresponding energy-band diagram.

FIG. 5 is a schematic diagram of a metal cathode 513 of a conventional capacitor 501 and the corresponding energy-band diagram. FIG. 5 shows the energy-band diagram for a metal 513 in a vacuum 511 in an electric field 96. As the electric field 96 increases, the slope of the triangular energy barrier 520 increases, thereby increasing the probability of an electron tunneling from the metal 513 into the vacuum 511 and increasing the electron emission from the metal valence band.

Figure 6:
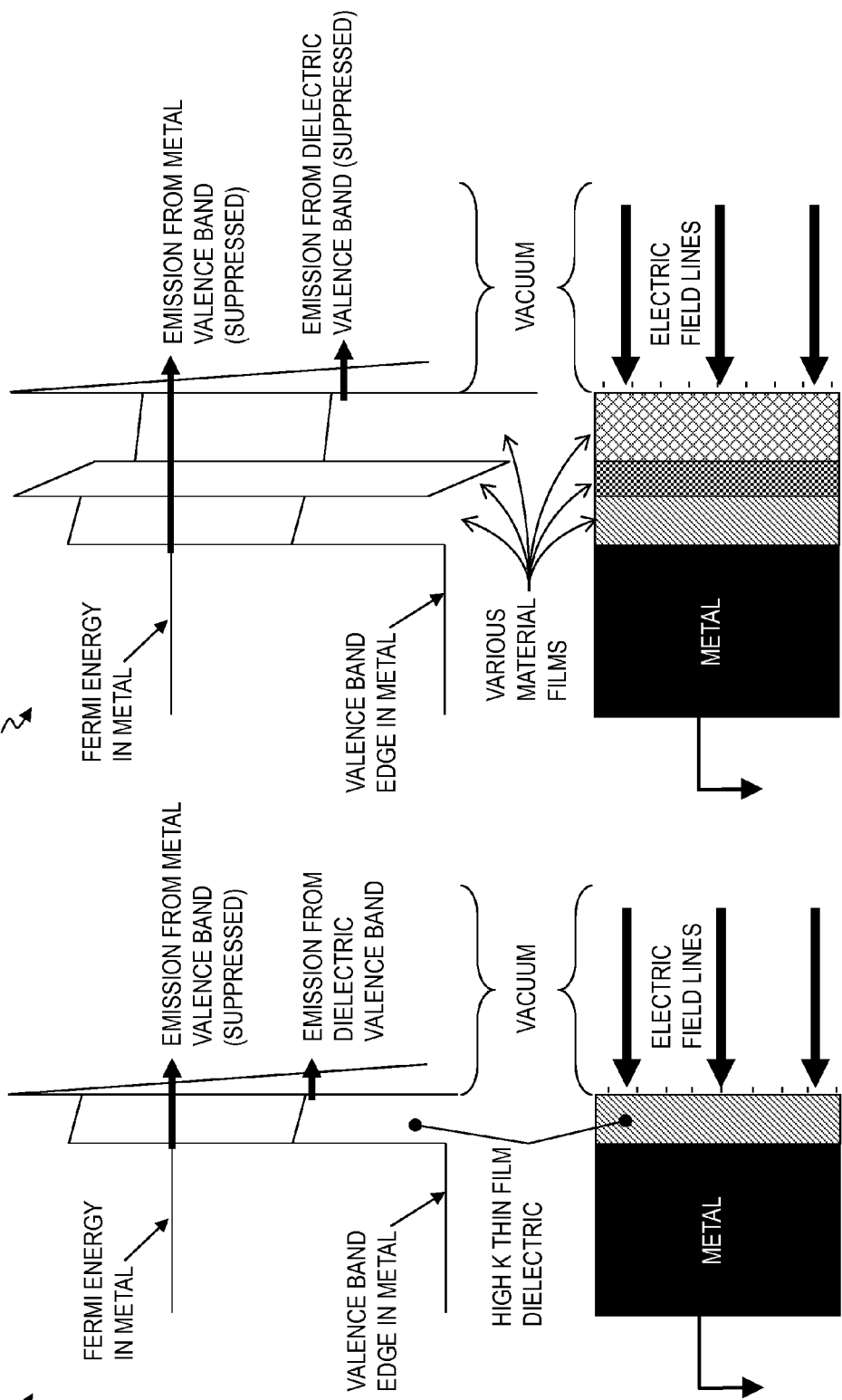
FIG. 6A is a cathode of a ultra-high energy-density capacitor 601 and the corresponding energy band diagram of a high-K thin-film dielectric on a metal in a vacuum, according to some embodiments of the present invention.
FIG. 6B is a cathode of a ultra-high energy-density capacitor 602 and the corresponding energy band diagram of a high-K thin-film dielectric on multiple high-K thin-film dielectric layers on a metal in a vacuum, according to some embodiments of the present invention.

FIG. 6A is the cathode 613 of an ultra-high energy-density capacitor 601 and the corresponding energy band diagram of a high-K thin-film dielectric 614 on a metal 613 in a vacuum 611, according to some embodiments of the present invention. In some embodiments, field emission of electrons from the cathode 613, as depicted in FIG. 6A, can effectively be suppressed via the use of a thin film (~3 nm) high-K dielectric 614. In some embodiments, K values greater than ~20 are used to reduce the field emission of electrons from the cathode 613. As can be seen in the energy band diagram of FIG. 6A, the probability of electrons at the Fermi energy 622 in the metal 613 tunneling into the vacuum 611 outside of the metal 613 can be dramatically reduced by introducing an energy barrier in the form of a high-K thin-film dielectric 614.

FIG. 6A shows an energy-band diagram for electrons on the negatively charged plate (cathode 613) of the present invention. The thin film of high-K material 614 on the metallic cathode 613 acts to suppress electron emission from the conduction band of the metal by reducing the tunneling probability from the Fermi level in the metal 613 to the vacuum 611. In some embodiments, a K value of between about ~50 to about ~100 and a thickness of about ~3 nm are used to reduce the emission current. Electron emission from the valence band of the dielectric will be discussed below.

FIG. 6B is a cathode 612 of an ultra-high energy-density capacitor 602 and the corresponding energy band diagram of multiple high-K thin-film dielectric layers (614.1, 614.2, and 614.3) on a metal 613 in a vacuum 611, according to some embodiments of the present invention. In some embodiments, the multiple high-K thin-film dielectric layers (614.1, 614.2, and 614.3) are used to significantly reduce both the electron field emission from the Fermi level of the metal 613 to the vacuum 611 and the electron field emission from the valence bands of the multiple dielectric layers (614.1, 614.2, and 614.3) to the vacuum.

Figure 7:
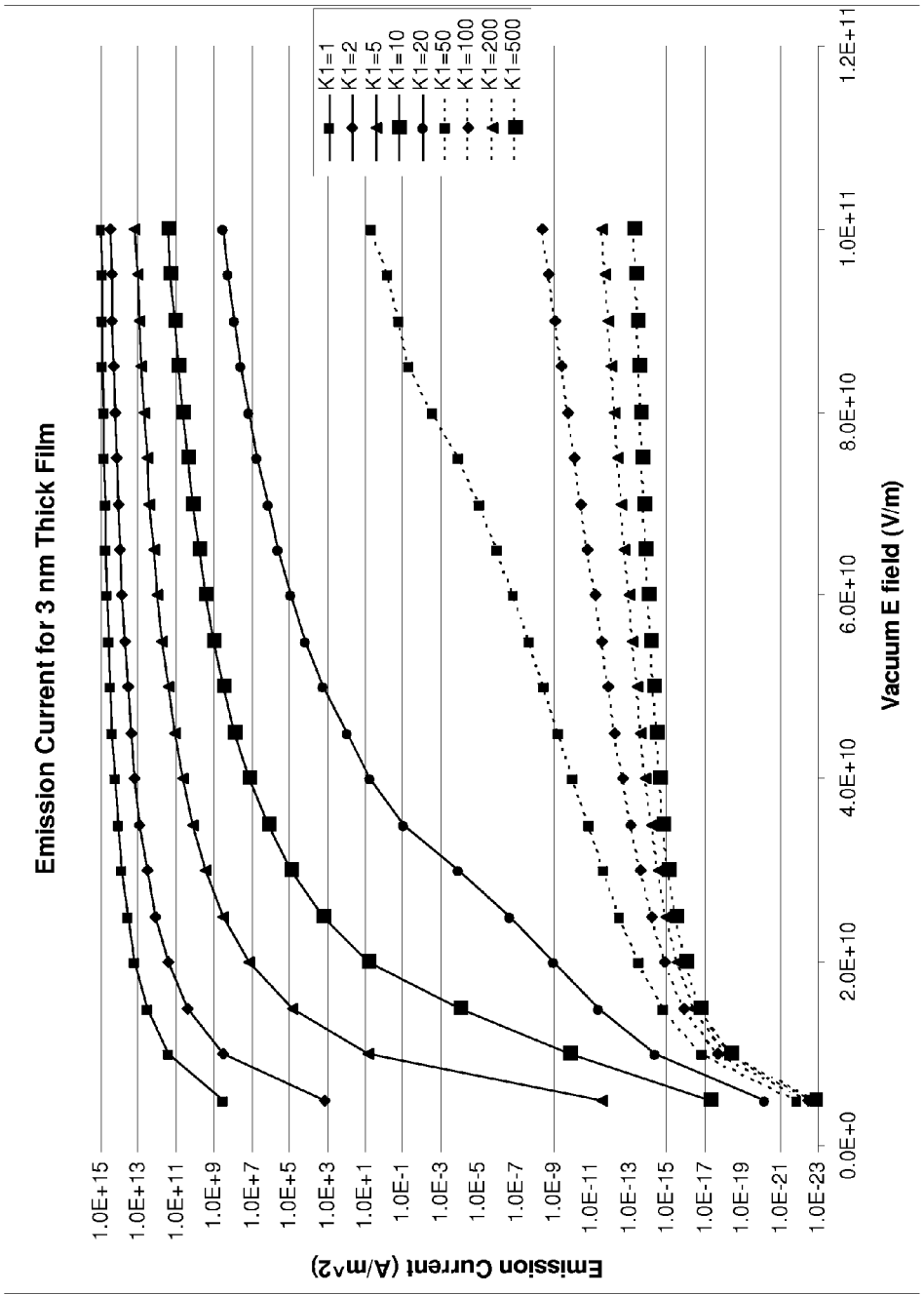
FIG. 7 is a graph 701 of the electron emission current for a metallic cathode having a 3 nm thick dielectric film as a function of electric field strength for various dielectric constants, according to some embodiments of the present invention.

FIG. 7 is a graph 701 of the electron emission current for a metallic cathode having a 3 nm thick dielectric film as a function of electric field strength for various dielectric constants, according to some embodiments of the present invention. Current emission calculations based on a free-electron parabolic conduction band model in the metal and full Airy function solutions to the Schrodinger equation for determining tunneling probability are shown in FIG. 7. In some embodiments, the presence of a 3 nm thick dielectric film of various K values can be seen to dramatically reduce the emitted current when the K value is approximately 20 or higher. This result can be understood as the inability of the electrons in the metal to find allowed energy states in the high-K thin-film dielectric and thus the electrons are unable to penetrate through the dielectric thin-film and into the vacuum.

While the plots of FIG. 7 do not address the issue of electron emission from the valence band of the thin film dielectric (depicted in FIG. 6A and FIG. 6B), studies of valence band emission of electrons from sharp tips of silicon and diamond suggest that adequate valence band field emission thresholds on flat surface geometries with acceptable leakage currents can be achieved.

In some embodiments, FIG. 7 is a calculated electron emission conduction band current vs. electric field strength for a metallic cathode with a 3 nm thick dielectric film of various K values (i.e., K1 in the FIG. 7). Full Airy function solutions are used in the solution of the Schrodinger equation to obtain the tunneling probabilities. In some embodiments, the emission current is substantially reduced for K values greater than about ~20.

Figure 8:
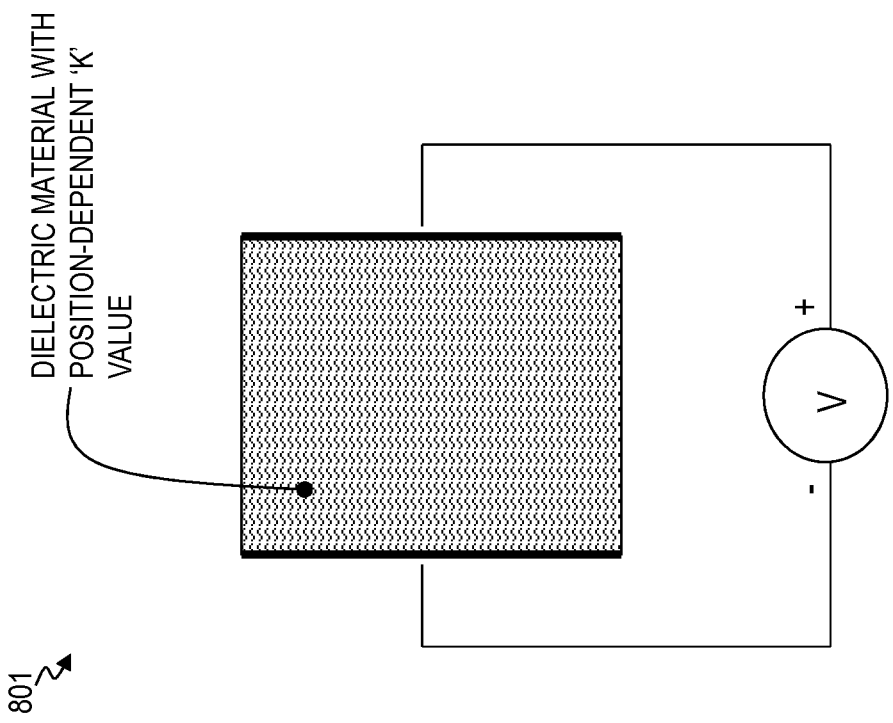
FIG. 8 is a schematic diagram of an ultra-high energy density capacitor 801, according to some embodiments of the present invention.

FIG. 8 is a schematic diagram of an ultra-high energy density capacitor 801, according to some embodiments of the present invention. In some embodiments, capacitor 801 has a 'K' value of the dielectric material 830 is engineered to change with position. In some embodiments the variation in K is in a direction that is horizontal, relative to FIG. 8 and is used to enhance energy-storage density. In some embodiments, the variation in K is in a direction that is vertical relative to FIG. 8 and is used to enhance the structural integrity of capacitor 801. In some embodiments, the variation in K is both horizontal and vertical, relative to FIG. 8 in order to increase energy-storage density and structural integrity of capacitor 801. In some other embodiments, the variation in 'K' value is in multiple directions (vertical, horizontal, or other) in order to induce spatial variations in electric field in the capacitor gap region. In some embodiments, leakage currents between the plates (812 and 813) are greatly reduced by properly engineering the dielectric material 830 to have a spatially dependent dielectric constant, K. In some embodiments, the electrodes (812 and 813) are optionally coated with thin films (e.g., dielectric thin films) to further reduce leakage currents in capacitor 801. The 'K' value of the dielectric material is engineered to change with position. In some embodiments the variation in K is horizontal relative to this figure (i.e., to enhance storage density). In some embodiments the variation in K is horizontal and vertical relative to this figure (i.e., to enhance structural integrity). In some embodiments the variation in K is vertical relative to this figure. In other embodiments, the variation in 'K' value could be in any direction (vertical, horizontal, or other). Spatial variations in K induce spatial variations in electric field. Leakage currents between the plates can be greatly reduced. Electrodes are optionally coated with thin films to further reduce leakage currents.

FIG. 9 is a Table 901 comparing the energy density in Watt-Hours per Liter for various energy storage technologies, according to some embodiments of the present invention. In some embodiments, at an electric-field strength of 1.25 e10 V/m (i.e., 1.25 times $10^{10}$ volts per meter), the capacitor of the present invention has an energy density of approximately 100 W-Hr/liter; an e-field that is achievable with an acceptable leakage current. As shown in Table 901, W-Hr/liter is ~10× the value for existing conventional electrochemical double layer capacitors (EDLC) ultracaps. In some embodiments, higher E-fields (~2.5 e10 V/m (i.e., ~2.5 times $10^{10}$ volts per meter) are provided, thereby allowing the capacitor of the present invention to be competitive with conventional lithium ion batteries. At an electric-field strength of 1.25 E10 V/m (i.e., 1.25 times $10^{10}$ volts per meter), an energy density of 100 W-Hr/l is achieved. This e-field is likely achievable with acceptable leakage current. 100 W-Hr/l is ~10× the value for existing electrochemical double layer capacitors (EDLC) ultracaps. If higher e-fields (~2.5 e10 V/m (i.e., ~2.5 times $10^{10}$ volts per meter)) can be achieved with acceptable leakage the HKTF vacuum cap becomes competitive with lithium ion batteries.

Figure 10:
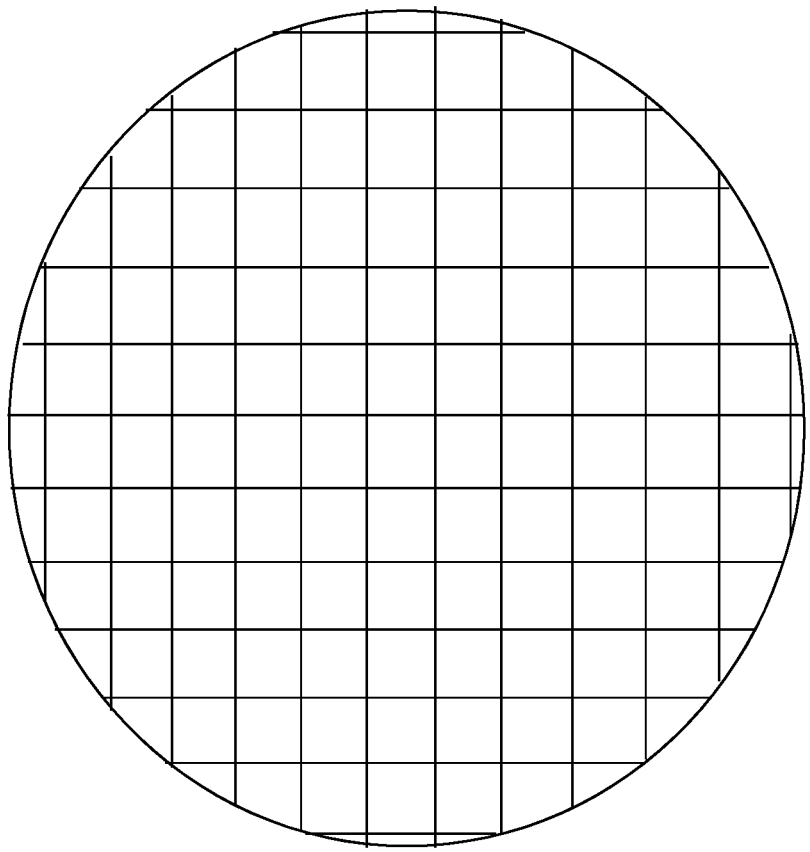
FIG. 10 is a schematic diagram of a capacitor die map 1001, according to some embodiments of the present invention.

FIG. 10 is a schematic diagram of a capacitor die map 1001, according to some embodiments of the present invention. In some embodiments, the capacitor die layout is ~1 cm die on an 8 inch wafer, thereby providing approximately ~314 die/wafer. In some embodiments, each wafer contains a single layer of capacitors and the final product consists of a stack of these layers. In some other embodiments, the present invention is integrated with electronics, active devices or the like either on wafer, during packaging, or during product assembly. As an example, ~1 cm die on an 8 inch wafer will provide ~314 die/wafer. In some embodiments, each wafer contains a single layer of capacitors, and the final product consists of a stack of these layers. In some embodiments, the present invention is integrated with electronics, active devices, or the like.

Figure 11:
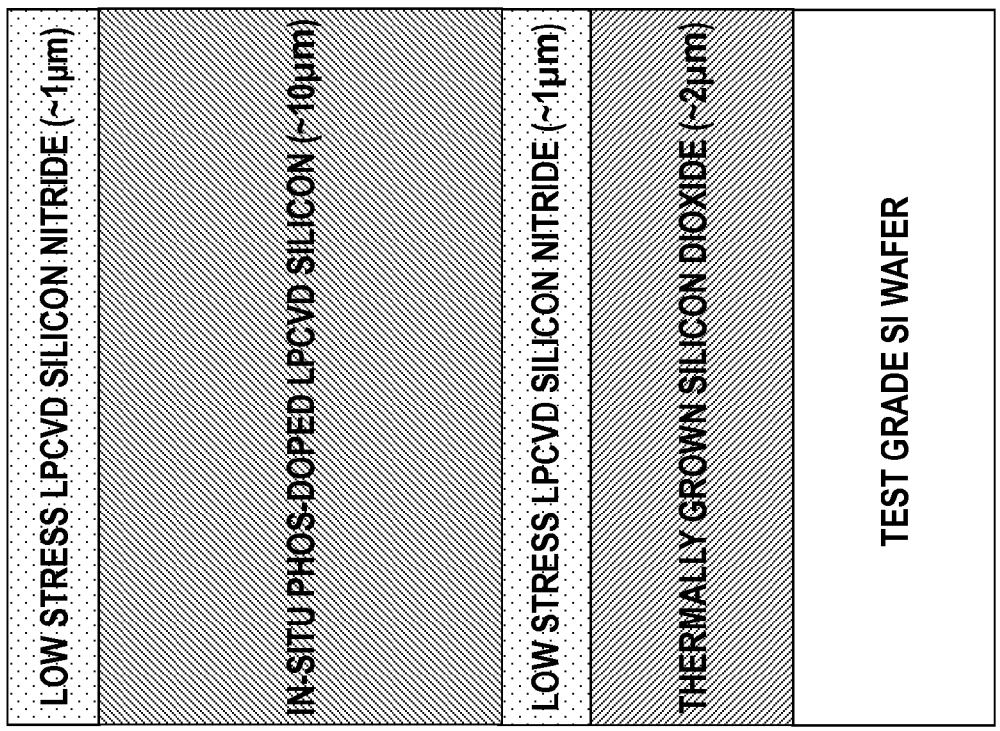
FIG. 11 is a schematic diagram of a material layer structure 1101 for an ultra-high energy density capacitor, according to some embodiments of the present invention.

FIG. 11 is a schematic diagram of a material layer structure 1101 for an ultra-high energy density capacitor, according to some embodiments of the present invention. In some embodiments, starting substrate is a low-cost test-grade silicon wafer or the like. In some other embodiments, the starting substrate is a semiconductor material, an insulating material, or a conducting material. In some embodiments, all capacitor layers are grown or deposited in high volume batch furnace processes. In some embodiments, an $SiO_2$ film is used as a 'release' layer to separate the finished capacitor structure from the starting substrate. In some embodiments, laser lift-off is used to separate the capacitor structure from the starting substrate. In some embodiments, other release layers may include $Si_3N_4$, SiON or the like. In some embodiments, the starting substrate is a low-cost test-grade silicon wafer or the like. In some embodiments, all layers can be grown or deposited in high volume batch furnace processes. In some embodiments, the $SiO_2$ film is a 'release' layer to separate the finished capacitor structure from the substrate. Other release layers may include $Si_3N_4$, SiON or the like.

In some embodiments, material layer structure 1101 includes substrate 1140, thermally grown silicon dioxide layer 1141 grown on substrate 1140, silicon nitride layer 1142 grown on silicon dioxide layer 1141, in-situ phosphorus-doped LPCVD silicon 1143 grown on silicon nitride layer 1142, and a second silicon nitride layer 1144 grown on in-situ phosphorus-doped LPCVD silicon 1143. In some embodiments, silicon dioxide layer 1141 is a release layer. In some embodiments, silicon nitride layer 1142, in-situ phosphorus-doped LPCVD silicon 1143, and silicon nitride layer 1144 are the material layers that are used to form the capacitor structure.

Figure 12B:
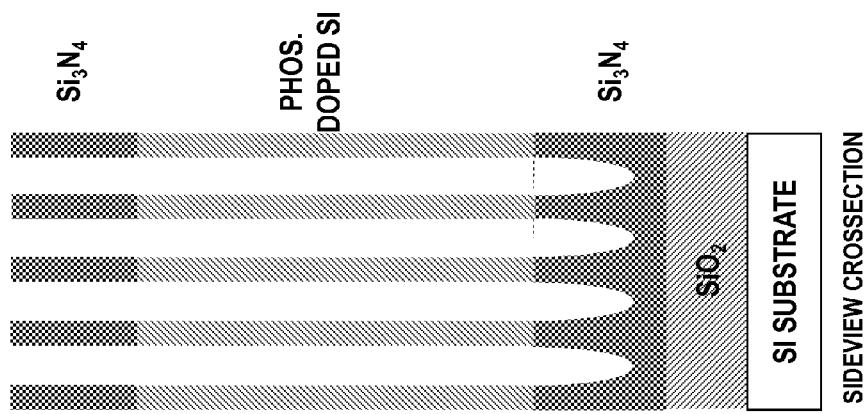
FIG. 12B is a side-view cross-section of an ultra-high energy density capacitor 1202, according to some embodiments of the present invention.
Figure 12A:
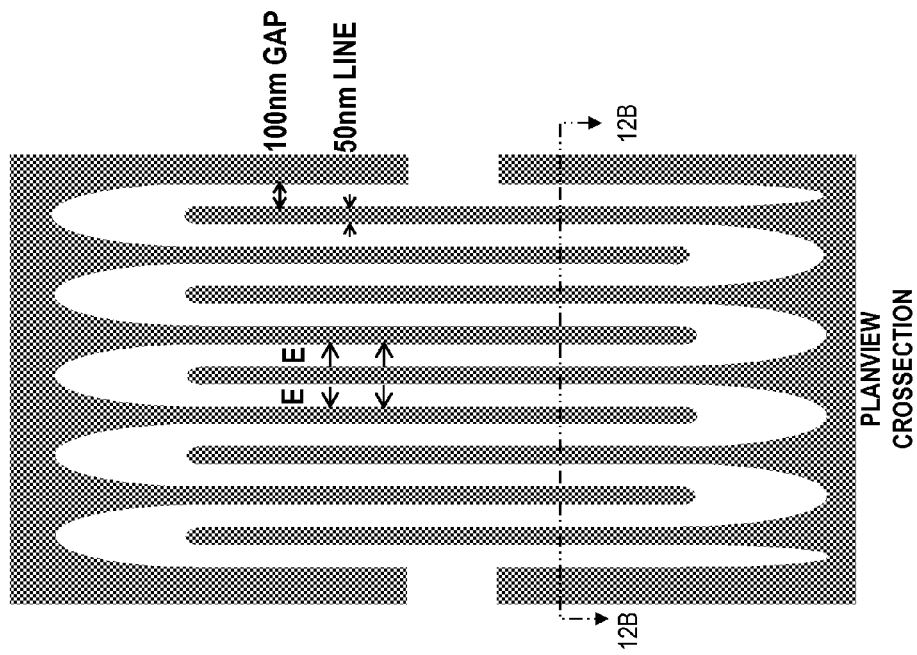
FIG. 12A is a plan-view cross-section of an ultra-high energy density capacitor 1201, according to some embodiments of the present invention.

FIG. 12A is a plan-view cross-section of an ultra-high energy density capacitor 1201, according to some embodiments of the present invention. FIG. 12B is a side-view cross-section of an ultra-high energy density capacitor 1202, according to some embodiments of the present invention. In some embodiments, each die consists of an alternating anode/cathode array with 50 nm lines and 100 nm spaces. Other appropriate spacings, depending on the application, can be used. In some embodiments, the first (and only) high-resolution lithography step, probably requiring a high NA 248 or 193 tool. In some embodiments, a high aspect ratio Si trench etch is provided via an ICP plasma etch tool. In some embodiments, an alternating anode/cathode structure is used. In some embodiments, corners and edges are rounded via silicon oxidation/HF etch to avoid e-field spiking. In some embodiments, end regions in both planview and cross-section are flared to gradually reduce e-field intensity.

In some embodiments, each capacitor die consists of an alternating anode 1212/cathode 1213 array with 50 nm lines and 100 nm spaces. Other appropriate spacings are used depending on the specific requirements of the application. In some embodiments, a first (and only) high-resolution lithography step requires a high-NA 248 or 193 lithography tool to define the capacitor structure. In some embodiments, a high-aspect-ratio Si trench etch via an ICP plasma etch tool is used to etch the capacitor material stack 1101 described above to achieve capacitor structure 1202. In some embodiments, alternating anode 1212/cathode 1213 structure include corners and edges that are rounded via a silicon oxidation followed by an HF etch to minimize and prevent E-field spiking. In some embodiments, end regions in both planview and cross-section are flared to gradually reduce E-field intensity. The nitride support structure 1242 (that remains from original silicon nitride layer 1142 after the etch) supports the base edges of each of the electrodes 1243, and the edges of the electrodes 1243 that are distal from the base edges connect to the nitride tops 1244 that remain from the original low-stress LPCVD silicon-nitride layer 1144.

Figure 13:
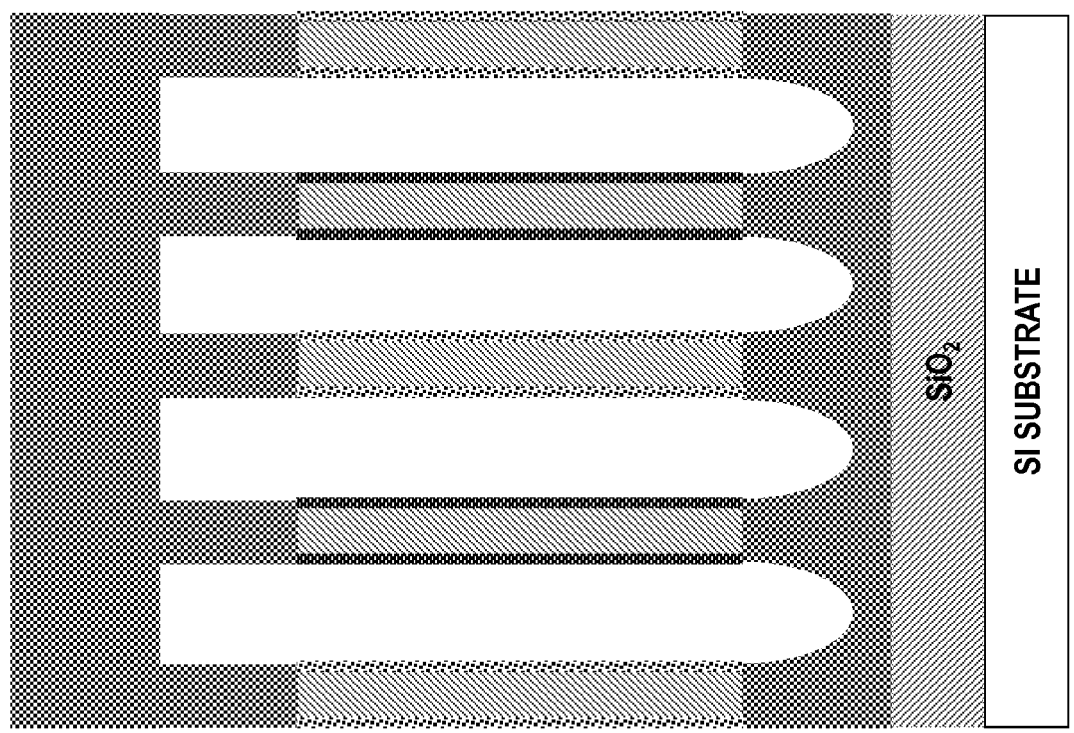
FIG. 13 is a side-view cross-section of an ultra-high-energy-density capacitor 1301, according to some embodiments of the present invention.

FIG. 13 is a side-view cross-section of an ultra-high-energy-density capacitor 1301, according to some embodiments of the present invention. In some embodiments, the anode 1312 is coated with $TiO_2$ 1350 or some such other film and the cathode 1313 is coated with tungsten 1351 or some such other film. In some embodiments, the capacitor structure is subsequently capped with a nitride 1345 or other such film having a thickness of ~2 µm using a wafer bonding technique. In some embodiments, the anode is coated with $TiO_2$ or some other film and the cathode is coated with tungsten or some other film. The structure is subsequently capped with a nitride or other film (~2 µm) using a wafer-bonding technique.

Figure 14A:
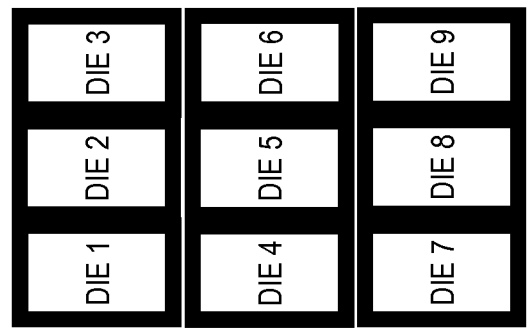
FIG. 14A is a schematic diagram of capacitor die layout 1401, according to some embodiments of the present invention.
Figure 14B:
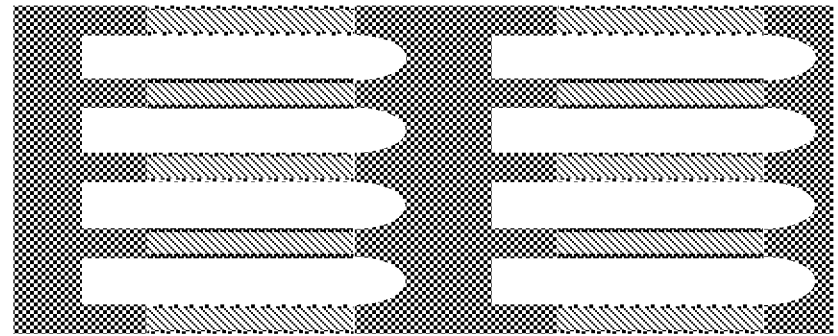
FIG. 14B is a side-view cross-section of an ultra-high-energy-density capacitor 1402, according to some embodiments of the present invention.

FIG. 14A is a schematic diagram of capacitor die layout 1401, according to some embodiments of the present invention. FIG. 14B is a side-view cross-section of an ultra-high-energy-density capacitor 1402, according to some embodiments of the present invention. In some embodiments, the perimeter around each die is exposed and the entire film stack, including the capping nitride layer, is etched down to the underlying oxide layer 1341. The figure shows nitride support structure 1342 (remaining from original silicon nitride layer 1142) supports the base of each of the electrodes 1343, and the edges of the electrodes that are distal from the base edges connect to the nitride tops 1344 remaining from the original low-stress LPCVD silicon-nitride layer 1144. In some embodiments, HF is then used to etch approximately 90% or greater of the $SiO_2$ layer, leaving the $SiO_2$ layer only lightly attached to the substrate. In some embodiments, the die are then picked off the substrate, tested, bonded and stacked to form the final product. In some embodiments, electrical contacts to the anode and cathode are opposite faces of the product 'cube' that is formed.

Figure 15A:
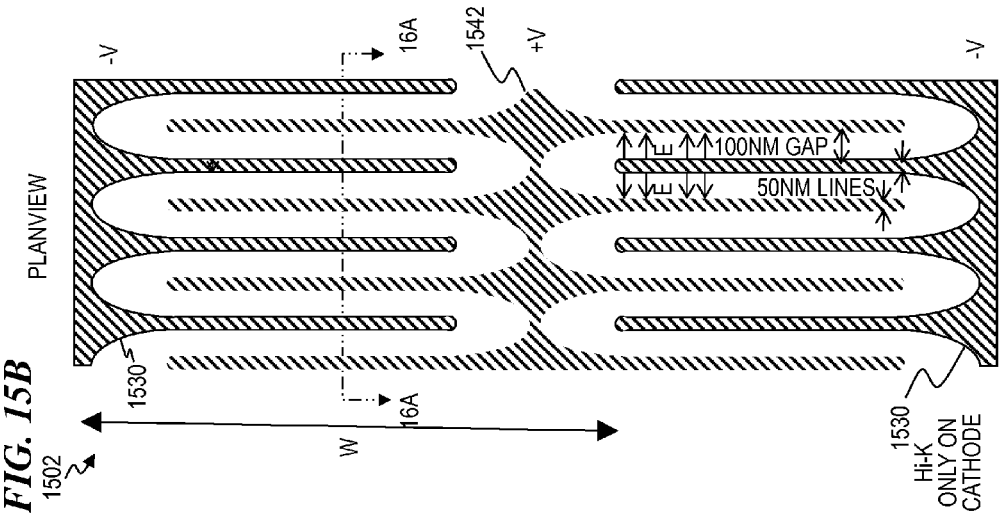
FIG. 15A is a side-view cross-section of an ultra-high energy density capacitor 1501, according to some embodiments of the present invention.
Figure 15B:
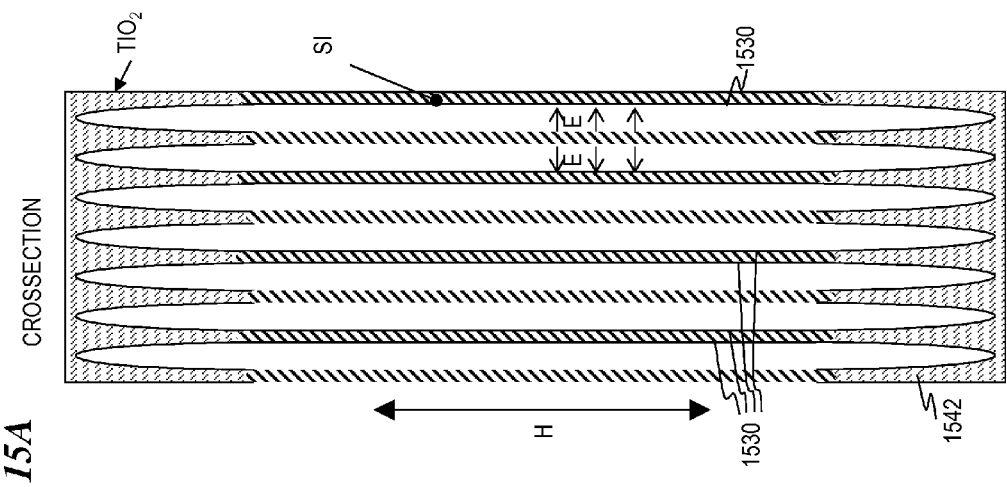
FIG. 15B is a plan-view cross-section of an ultra-high energy density capacitor 1502, according to some embodiments of the present invention.

FIG. 15A is a side-view cross-section of an ultra-high energy density capacitor 1501, according to some embodiments of the present invention. FIG. 15B is a plan-view cross-section of an ultra-high energy density capacitor 1502, according to some embodiments of the present invention. In some embodiments, the present invention includes: interdigitated line/space array, bulk of structure is doped silicon (light blue), support structure is primarily $TiO_2$ (black), corners and edges are rounded to avoid e-field spiking, end regions in both planview and cross-section are flared to gradually reduce e-field intensity, Si is coated with CVD $TiO_2$, with 50-nm lines and 100-nm gaps, along with sufficiently large 'w' and 'h', 50% fill factor should be achievable, and the array can be expanded in the height (h) or width (w) directions for increased energy fill fraction.

In some embodiments, the present invention includes interdigitated line/space array of parallel-plates, etched from a bulk material structure of in-situ doped silicon, a support structure 1542 primarily is formed by silicon nitride layer 1342 (see FIG. 14B), cathodes coated with an insulating material 1530 (e.g., in some embodiments, $TiO_2$), corners and edges that are rounded to avoid E-field spiking, and end regions in both planview and cross-section are flared to gradually reduce E-field intensity. In some embodiments, the exposed doped-Si bulk material of cathodes 1540 is coated with CVD $TiO_2$ 1530. In some embodiments, 50 nm lines and 100 nm gaps, along with sufficiently large 'w' and 'h', allows for a 50% fill factor to be achievable. In addition, in some embodiments, the capacitor interdigitated line/space array is expanded in the height (h) or width (w) directions, or both in the height and width directions to increase the energy fill fraction.

Figure 16:
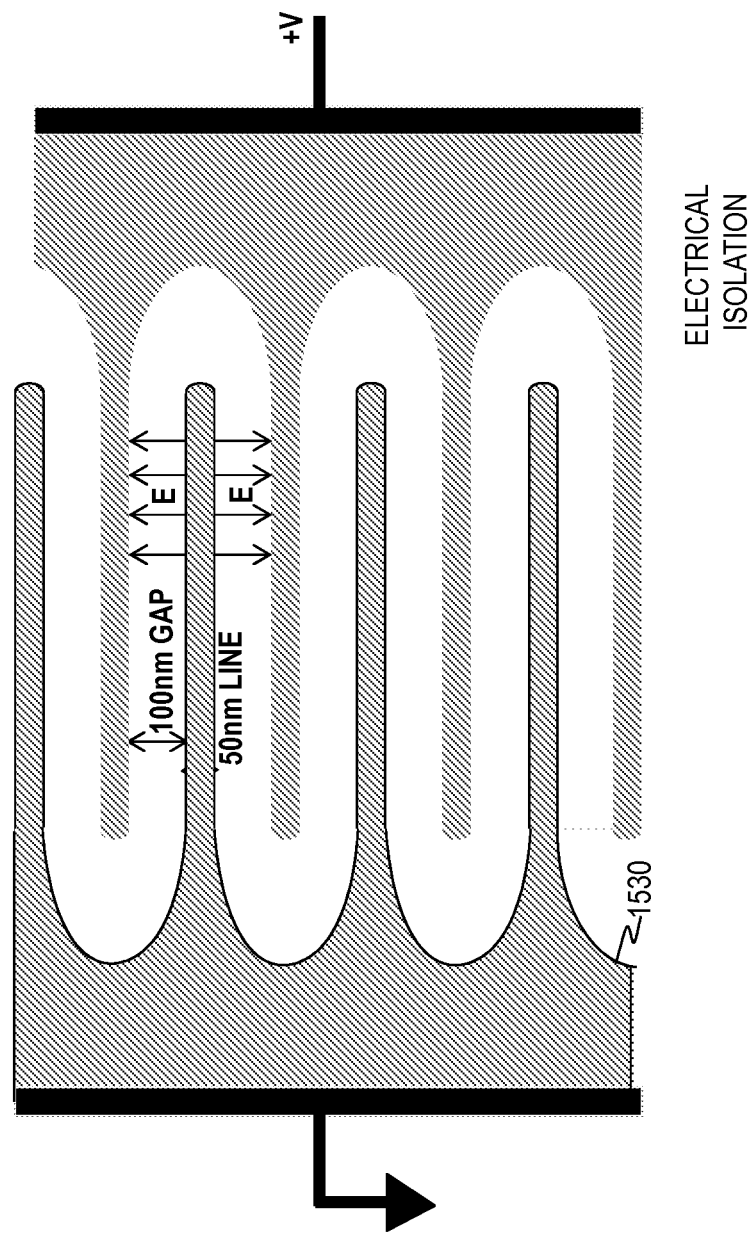
FIG. 16 is a plan-view cross-section of an ultra-high energy density capacitor 1601, according to some embodiments of the present invention.

FIG. 16 is a plan-view cross-section of an ultra-high energy density capacitor 1601, according to some embodiments of the present invention. In some embodiments, the present invention includes: Only two leads needed for capacitor, 20 μm of $SiO_2$ isolation will easily sustain 10,000 V. As long as leads to/from the line/space array are kept apart by at least 20 μm of $SiO_2$ they can be kept electrically isolated. Typical bond pad spacing on a silicon IC is ~80 to 100 μm. In some embodiments, the present invention includes: only two leads needed for capacitor, 20 μm of $SiO_2$ isolation will easily sustain 10,000 V. As long as leads to/from the line/space array are kept apart by at least 20 microns of $SiO_2$ they can be kept electrically isolated. Typical bond pad spacing on a silicon IC is ~80 to 100 μm.

FIG. 17 is a plan-view cross-section of an ultra-high energy density capacitor assembly 1701, according to some embodiments of the present invention. In some embodiments, capacitor assembly 1701 includes a plurality of interdigitated line/space capacitor arrays 1740 as described above to form the ultra-high energy density vacuum capacitors integrated inside of a vacuum cavity 1790 formed from positive conductor wall 1780, ground conductor wall 1781, and two insulating walls 1782. In addition, in some embodiments, capacitor assembly 1701 includes dedicated micro-Titanium sublimation pump 1717 (in some embodiments, high-electric-field micro-ion pumps are used) are integrated with the main ultra-high energy density vacuum capacitors and used to getter residual gas molecules prior to actual use of the capacitors of interest.

FIG. 18 is a plan-view cross-section of an ultra-high energy density capacitor assembly 1801, according to some embodiments of the present invention. In some embodiments, capacitor assembly is substantially similar to capacitor assembly 1701 described above except that capacitor assembly 1801 has a modified interdigitated line/space capacitor arrays 1840 to demonstrate an alternative embodiment of the present invention.

In some embodiments, the present invention will find benefit in the approximately $100 million ultra-capacitor market (as measured in 2007 with an 8% annual growth rate) and the approximately $200 million ultra-capacitor market predicted to be realized by 2014. In some embodiments, the present invention provided benefits for many markets, including, transportation (e.g., hybrid-electric vehicles), industry (e.g., Uninterruptible Power Supplies (UPS)), consumer electronics (e.g., digital cameras and mobile phones), and the like.

In some embodiments, the vacuum capacitors of the present invention provide performance improvements that exceed existing ultracaps by factors of approximately 5 to 10 and are competitive with cost, size and weight metrics.

In some embodiments, the present invention enables capacitor devices capable of competing with conventional chemical batteries (e.g., Li-Ion, NiCd, NiMH, and the like) and impacting the approximately $8 billion chemical battery market. In some embodiments, the capacitors of the present invention enable a capacitor-based all-electric vehicle having superior performance to gasoline-powered vehicles.

In some embodiments, the capacitor devices of the present invention provide the following benefits:
  Very fast charging times compared to conventional batteries
  Deliver much higher peak currents compared to conventional batteries
  Manufactured from silicon, tungsten, titanium dioxide, and the like—inexpensive, non-toxic, easy to manufacture with readily available materials
  Very long device lifetimes (i.e., millions of charge/discharge cycles)
  Easily and quickly rechargeable in the field
  Easy to use by both designers and consumers
  Small logistical footprint due to small size, low weight, long life, lack of special requirements for storage and transport, and the absence of toxicity
  Much higher energy density than existing EDLC ultracaps In some embodiments, the capacitor devices of the present invention will find benefit for use in electric vehicles, electric rail, electric buses, electric forklifts, electric cranes, electric based vehicles of all kinds, uninterruptible power supplies, dc power systems, wind turbines, emergency lighting, digital cameras, mobile phones, toys, wireless remote controllers, PDAs (personal data assistants), consumer electronics in general, all applications requiring wide temperature ranges from several hundreds of degrees c down to absolute zero, consumer electronics operating in a temperature range of –55° C. to 125° C., all energy storage applications where weight is important (e.g., aircraft, spacecraft, land based vehicles, and the like) due to the high energy/weight figure of merit, and all applications where high energy density (energy/volume) is important.

Figure 19:
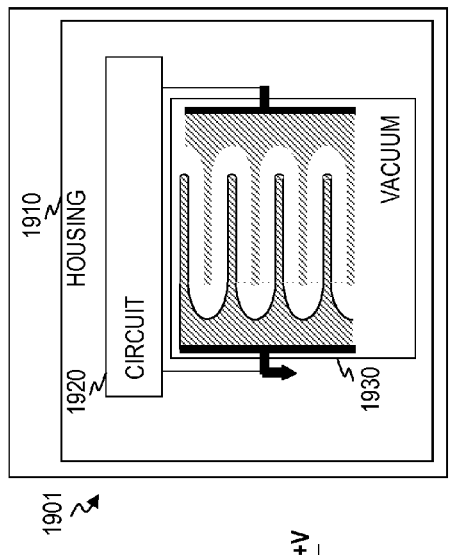
FIG. 19 is a schematic drawing of an apparatus 1901 having an energy-storage device 1930 electrically coupled to a circuit 1920 within a housing 1910, according to according to some embodiments of the present invention.

In some embodiments, such as shown in FIG. 19, the present invention provides a first apparatus 1901 having an energy-storage device 1930 that includes: a plurality of electrically conducting electrodes including a first electrode and a second electrode separated by a non-electrically conducting region, wherein the non-electrically conducting region further includes a non-uniform permittivity (K) value. In some embodiments of the apparatus, the first electrode is a cathode and the second electrode is an anode, wherein at least the cathode has a coating of dielectric that has a permittivity value of at least twenty (20). In some embodiments of the apparatus, the anode contains a refractory material that does not melt at temperatures below 1800 degrees C. In some embodiments of the apparatus, said non-electrically conducting region includes a film of dielectric material on the cathode and a vacuum between the dielectric material on the cathode and the anode, and wherein the dielectric material has a permittivity value of at least twenty (20). In some embodiments of the apparatus, the film of dielectric material does not contact the anode. In some embodiments of the apparatus, the energy-storage device is a capacitor. In some embodiments, the first apparatus 1901 further includes a housing 1910; and an electrical circuit 1920 within the housing 1910 and electrically coupled to the energy-storage device 1930 to use energy from the energy-storage device to do work. In some embodiments, the first apparatus 1901 is a vehicle. In some embodiments, the first apparatus 1901 is an uninterruptible power supply.

In some embodiments, the present invention provides a method for manufacturing an energy-storage device, the method including providing a substrate; fabricating a first electrode on the substrate; and fabricating a second electrode such that the second electrode is separated from the first electrode by a non-electrically conducting region, wherein the non-electrically conducting region has a non-uniform permittivity (K) value. In some embodiments of the method, the fabricating of the first electrode includes depositing cathode conductor material on the substrate, and coating the cathode conductor material with a dielectric that has a permittivity value of at least twenty (20), and wherein fabricating of the second electrode includes depositing an anode conductor material. In some embodiments of the method, the anode material contains a refractory material that does not melt at temperatures below 1800 degrees C. In some embodiments of the method, the fabricating of the first electrode includes depositing cathode conductor material on the substrate, and coating the cathode conductor material with a dielectric that has a permittivity value of at least twenty (20), and the fabricating of the second electrode leaves a vacuum between the dielectric material on the cathode and the second electrode. In some embodiments of the method, the film of dielectric material does not contact the anode. In some embodiments of the method, the energy-storage device is a capacitor. In some embodiments, the method further includes: forming a housing 1910; locating an electrical circuit 1920 within the housing and electrically coupling the energy-storage device 1930 to the circuit 1920; and using energy from the energy-storage device 1930 to do work.

In other embodiments, the present invention provides a second apparatus that includes: a substrate; means for fabricating a first electrode on the substrate; and means for fabricating a second electrode such that the second electrode is separated from the first electrode by a non-electrically conducting region, wherein the non-electrically conducting region has a non-uniform permittivity (K) value. In some embodiments of the second apparatus, the means for fabricating the first electrode includes means for depositing cathode conductor material on the substrate, and means for coating the cathode conductor material with a dielectric that has a permittivity value of at least twenty (20), and wherein the means for fabricating of the second electrode includes means for depositing an anode conductor material. In some embodiments of the second apparatus, the anode material contains a refractory material that does not melt at temperatures below 1800 degrees C. In some embodiments of the second apparatus, the means for fabricating the first electrode includes means for depositing cathode conductor material on the substrate, and means for coating the cathode conductor material with a dielectric that has a permittivity value of at least twenty (20), and the means for fabricating the second electrode means for leaving a vacuum between the dielectric material on the cathode and the second electrode. In some embodiments of the second apparatus, the film of dielectric material does not contact the anode. In some embodiments of the second apparatus, the energy-storage device is a capacitor.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An apparatus comprising:
   a capacitor that includes:
      an anode; and
      a cathode that has a first surface facing the anode, wherein the first surface includes a first dielectric film that has a permittivity value of at least twenty (20), wherein the capacitor maintains a vacuum in a region that separates the anode and the dielectric coating on the cathode, and wherein the capacitor supports an operational regime having an electric field of at least 7 times $10^9$ V/m.

2. The apparatus of claim 1, wherein the first dielectric film does not contact the anode.

3. The apparatus of claim 1, wherein the anode contains a refractory material that does not melt at temperatures below 1800 degrees C.

4. The apparatus of claim 1, further comprising:
   a housing;
   an electrical circuit within the housing and electrically coupled to the capacitor to use energy from the capacitor to do work.

5. The apparatus of claim 1, wherein the apparatus includes a semiconductor substrate, and wherein the anode and the cathode form parallel walls extending at substantially right angles from the substrate.

6. The apparatus of claim 1, wherein the first dielectric film is about 3 nm thick.

7. The apparatus of claim 1, wherein the first dielectric film has a K value of between about 50 and about 100.

8. A method for manufacturing a capacitor, the method comprising:
   providing a substrate;
   fabricating an anode and a cathode on the substrate such that the cathode has a first surface facing the anode;
   coating the first surface with a first dielectric film that has a permittivity value of at least twenty (20); and
   maintaining a vacuum in a region that separates the anode and the dielectric coating on the cathode, wherein the capacitor supports an operational regime having an electric field of at least 7 times $10^9$ V/m.

9. The method of claim 8, wherein the first dielectric coating does not contact the anode.

10. The method of claim 8, wherein the anode contains a refractory material that does not melt at temperatures below 1800 degrees C.

11. The method of claim 8, wherein the substrate includes a semiconductor substrate, and wherein the fabricating of the anode and the cathode forms parallel walls extending at substantially right angles from the substrate.

12. The method of claim 8, further comprising:
   forming a housing;
   locating an electrical circuit within the housing and electrically coupling the capacitor to the circuit; and
   using energy from the capacitor to do work.

13. The method of claim 8, wherein the coating of the first surface with the first dielectric film results in first dielectric film being about 3 nm thick.

14. The method of claim 8, wherein the first dielectric film has a K value of between about 50 and about 100.

15. An apparatus for manufacturing a capacitor comprising:
   means for fabricating an anode and a cathode on a substrate such that the cathode has a first surface facing the anode;
   means for coating the first surface with a first dielectric film that has a permittivity value of at least twenty (20); and means for maintaining a vacuum in a region that separates the anode and the dielectric coating on the cathode, wherein the capacitor supports an operational regime having an electric field of at least $7 \times 10^9$ V/m.

16. The apparatus of claim 15, wherein the means for fabricating the anode and the cathode and the means for coating the first surface with a first dielectric film form the capacitor such that the first dielectric coating does not contact the anode.

17. The apparatus of claim 15, wherein means for fabricating the anode provide the anode with a refractory material that does not melt at temperatures below 1800 degrees C.

18. The apparatus of claim 15, wherein the substrate includes a semiconductor substrate, and wherein the means for fabricating the anode and the cathode forms parallel walls extending at substantially right angles from the substrate.

19. The apparatus of claim 15, further comprising:
means for forming a housing;
means for locating an electrical circuit within the housing and electrically coupling the capacitor to the circuit; and
means for using energy from the capacitor to do work.

20. The apparatus of claim 15, wherein the means for coating of the first surface with the first dielectric film results in a 3-nm thick first dielectric film having a K value of between about 50 and about 100.

* * * * *